US 6,534,134 B1

(12) United States Patent
Fernandez

(10) Patent No.: US 6,534,134 B1
(45) Date of Patent: Mar. 18, 2003

(54) APPARATUS AND METHOD FOR PULSED LASER DEPOSITION OF MATERIALS ON WIRES AND PIPES

(75) Inventor: Felix E. Fernandez, Mayaguez, PR (US)

(73) Assignee: University of Puerto Rico, San Juan, PR (US)

(*) Notice: Subject to any disclaimer, the term of this patent is extended or adjusted under 35 U.S.C. 154(b) by 0 days.

(21) Appl. No.: 09/442,408

(22) Filed: Nov. 18, 1999

Related U.S. Application Data

(60) Provisional application No. 60/109,280, filed on Nov. 20, 1998.

(51) Int. Cl.⁷ .......................... C23C 14/28; C21D 9/08; B23K 26/073; B23K 26/08
(52) U.S. Cl. .................. 427/596; 427/561; 427/597; 219/121.75; 219/121.85; 148/519; 148/525
(58) Field of Search ................ 427/596, 597, 427/561, 586; 148/565, 519, 525; 219/121.75, 121.85

(56) References Cited

U.S. PATENT DOCUMENTS

| | | | | |
|---|---|---|---|---|
| 4,456,811 A | * | 6/1984 | Hella et al. | 219/121 |
| 4,537,791 A | * | 8/1985 | Tarjan | 427/596 |
| 4,816,293 A | * | 3/1989 | Hiramoto et al. | 427/596 |
| 5,049,405 A | * | 9/1991 | Cheung | 427/596 |
| 5,098,737 A | * | 3/1992 | Collins et al. | 427/561 |
| 5,372,862 A | | 12/1994 | Krishnaswamy | |
| 5,405,659 A | * | 4/1995 | Fernandez | 427/596 |
| 5,411,772 A | * | 5/1995 | Cheung | 427/561 |
| 5,426,092 A | * | 6/1995 | Ovshimsky et al. | 427/596 |
| 5,449,879 A | * | 9/1995 | Lawson et al. | 148/565 |
| 5,578,350 A | * | 11/1996 | Mai et al. | 427/561 |
| 5,624,722 A | * | 4/1997 | Nagaishi et al. | 427/596 |
| 5,672,210 A | * | 9/1997 | Moto et al. | 427/596 |
| 5,733,609 A | | 3/1998 | Wang | 427/586 |
| 5,747,120 A | * | 5/1998 | McLean, II et al. | 427/596 |
| 5,820,948 A | * | 10/1998 | Itozaki et al. | 427/561 |
| 6,146,714 A | * | 11/2000 | Beyer et al. | 427/596 |
| 6,203,861 B1 | * | 3/2001 | Kar et al. | 427/596 |

FOREIGN PATENT DOCUMENTS

| | | | | |
|---|---|---|---|---|
| DE | 43 39 490 C 1 | | 11/1993 | |
| DE | 4339490 | * | 3/1995 | |
| FR | 2607830 A1 | * | 6/1988 | |
| JP | 62-109924 | * | 5/1987 | 148/565 |
| JP | 62-174369 | * | 7/1987 | |
| JP | 64-8266 | * | 1/1989 | 427/596 |
| JP | 4-341576 | * | 11/1992 | 427/596 |

OTHER PUBLICATIONS

*Webster's Ninth New Collegiate Dictionary*, Merriam–Webster Inc., Springfield, Mass. USA, Excerpt. p. 1020, 1983 (no month).*
Translation of 62–174369 (Japanese) to Hamada et al, Jul. 1987.*
Translation of JP–4–34157 to Kusakake et al (English abstract uses Ichiro Kasabe), Nov. 1992.*
Translation of FR 2,607,830 A1 to Machet et al. Jun. 1988.*
Translation of DE 43 394 90 C1 to Dietsch et al, Mar. 1995.*

* cited by examiner

*Primary Examiner*—Marianne Padgett
(74) *Attorney, Agent, or Firm*—Patent Law Offices of Heath W. Hoglund

(57) ABSTRACT

Methods and apparatuses are disclosed which allow uniform coatings to be applied by pulsed laser deposition (PLD) on inner and outer surfaces of cylindrical objects, such as rods, pipes, tubes, and wires. The use of PLD makes this technique particularly suitable for complex multicomponent materials, such as superconducting ceramics. Rigid objects of any length, i.e., pipes up to a few meters, and with diameters from less than 1 centimeter to over 10 centimeters can be coated using this technique. Further, deposition is effected simultaneously onto an annular region of the pipe wall. This particular arrangement simplifies the apparatus, reduces film uniformity control difficulties, and can result in faster operation cycles. In addition, flexible wires of any length can be continuously coated using the disclosed invention.

7 Claims, 12 Drawing Sheets

APPARATUS AND METHOD FOR PULSED LASER DEPOSITION OF MATERIALS ON WIRES AND PIPES

This application claims the benefit of Provisional Application No. 60/109,280 filed, Nov. 20, 1998.

The subject matter of this application was made with the support of the U.S. government, under the following grants: No. N00014-96-1-0929, awarded by the Department of Defense; No. NCCW-0088, awarded by NASA; No. DE-FRO2-94ER757640, awarded by the Department of Energy; and No. EHR-9108775, awarded by the National Science Foundation. The U.S. government has certain rights in the invention.

The need for manufacturing pipes or tubes coated with thin films on their outer and/or inner walls, or for coating wires, can arise in many situations. Deposition of simple materials can be performed using currently available thin film deposition methods. However, for complex multicomponent materials (i.e., ternary or quaternary compounds, etc.) these techniques are generally unsuitable due, for example, to differential evaporation or sputtering rates. Also, traditional deposition techniques which can be utilized are cumbersome to use in practice due to the need to provide electric or water leads to the target region which would be located within the pipe to be coated. Chemical vapor deposition techniques, which could, in principle, be simple to use for some materials, have the disadvantage of requiring much higher temperatures than the pulsed laser deposition (PLD) technique employed in accordance with this invention.

PLD has proven to be a powerful thin film growth technique, particularly for multicomponent materials, such as complex oxides. However, PLD is commonly used to deposit materials onto flat, and usually small, substrates. In contrast, the method and apparatus presented here allows the use of PLD to deposit thin films on inner or outer cylindrical surfaces, such as pipe or tubing walls or on wires. Materials for which there is an interest in coating wires or external walls of pipes are high-critical-temperature (high-$T_c$) superconductors, such as Yttrium-Barium-Copper-Oxide ("YBCO") and other ceramic cuprates. PLD has been used to produce quality high-$T_c$ ceramic films such as YBCO-coated metallic (Ni—Cr alloy) tapes. This technique is useful because it allows the tape surface to be prepared by deposition of a "buffer" layer by PLD before the actual tape is deposited.

Despite the advances made in producing such tapes, wires would probably be preferred over tapes because the systems in which these materials can be used, e.g., electromagnets, motors, generators, power transmission lines, and transformers, can be more easily built using wires, or bundled wires (stranded cables). For transformers in particular there can be a very large market in the near future, as most power line transformers in the United States are approaching the end of their useful lives. Power generation utilities are apparently very interested in superconducting transformers, even if they must be immersed in liquid nitrogen.

First generation high-$T_c$ superconductors presently being used are powder-in-tube devices based on $Bi_2Sr_2CaCu_2O_x$ (BSCCO) material. While such devices do not lend itself to very many applications, kilometer-length tube pieces are currently produced commercially. However, BSCCO loses its superconductivity at modest magnetic fields. YBCO is a much better superconducting material, but cannot be used for powder-in-tube fabrication. Sintered, fully reacted YBCO pieces cannot be easily produced in very large or complex shapes, and, more importantly, are not flexible. Thin film-coated flexible pieces appear to be the best option for device application of YBCO in a large variety of situations.

Another area of interest is the application of diamond-like carbon (DLC) coatings to surfaces. DLC coatings can be useful for tribological applications, such as for enhancement of wear-resistance. Besides DLC, there are many other hard materials, such as carbides and nitrides, for which the PLD process is suitable. The methods presented in this disclosure could be readily applied to coat surfaces with cylindrical geometry, such as drill bits, shafts, motor pistons and cylinders.

A further use which is contemplated based on the methods presented in accordance with this invention is the coating of wires with materials exhibiting colossal magneto-resistance CM R, particularly the perovskite manganese oxide $La_{1-x}Ca_xMnO_3$ (similar to the copper oxides exhibiting superconductivity, but with manganese instead of copper). These materials, which are complex oxides, can be best applied via PLD. As these CMR materials were only recently discovered, technologies based on it are not yet fully developed, but there is much interest in relation to device applications based on ferromagnetics.

SUMMARY OF THE INVENTION

The present invention relates to an apparatus that allows the use of Pulsed Laser Deposition (PLD) to deposit thin films on inner cylindrical surfaces, such as inner pipe or tubing walls. In addition, the present invention relates to new methods for applying thin film coatings on outer surfaces of cylindrical objects. Specifically, the disclosed apparatus and methods rely on the PLD technique for the actual coating. These PLD techniques are particularly pertinent for coatings consisting of multicomponent inorganic materials, such as superconducting ceramics, or for materials which benefit from non-equilibrium growth conditions, such as diamond-like carbon (DLC).

In accordance with the present invention, when the materials to be deposited are on the inner walls of a pipe, a high power pulsed laser beam is caused to converge towards a target surface which is subsequently ablated by the laser beam. The target is located within the pipe to be internally coated, and at an inclination with respect to the system's axis, being defined as the symmetry axis of the pipe. As the material ablated from the target is deposited on the pipe wall, relative angular and longitudinal motion between the pipe and the target is produced, so that the wall is sequentially coated.

When materials are to be deposited on the outer walls of a wire or pipe, or the inner walls of a pipe in a symmetric fashion, the laser beam is shaped by suitable optics into a conic beam incident onto a conic target surface which is subsequently ablated by the laser. The cylindrical geometry is such that a cylindrical work piece, e.g., a rod, pipe, or wire, can be coated uniformly along its inner surface by the plume emitted by the target, while the work piece is translated along the axial direction.

The present invention is directed to a pulsed laser deposition method for uniformly depositing at least one material on an outer wall of a pipe. The method comprises passing a pulsed laser beam through at least one lens such that the laser beam is caused to converge towards a target surface. Once incident on the target surface, the beam will ablate the target surface. The target surface is preferably located within a pipe that is to be internally coated, and is at an inclination with respect to the symmetry axis of the pipe. In addition, a relative angular and longitudinal motion can be produced between the pipe and the target so that the wall can be sequentially coated. This method can occur either in a vacuum or in a low-pressure atmosphere, optionally other than air. Depending on the material to be coated, the inner wall to be coated can also be heated above room temperature.

The present invention is also directed to a pulsed laser deposition method for uniformly coating at least one material on an inner wall of a pipe or rod in a symmetric configuration. This method can be adapted for coating both outer walls of a pipe or rod, or flexible wires. The method comprises passing an axially symmetric, pulsed laser beam through appropriate optics that shape the beam into a cone or truncated cone. The optics used to form such a shape comprise at least one negative conical lens and at least one spherical converging lens. The symmetric configuration of the deposited material is a result of the collinear configuration between symmetry axes of a target surface and the lenses. To ablate the target material, the laser beam is subsequently converged towards the target surface. The cone or truncated cone shaped beam incident on the target material produces a plume of evaporate material also having a conical shape. By placing the rod, pipe or wire to be coated with its longitudinal axis coincident with the symmetry axes, the rate of evaporate material incident on the wall is substantially the same for every direction in the plume.

Depending on the material to be coated, the walls to be coated can again be heated above room temperature. In addition, when flexible wires are to be coated, the above method can be modified to allow for the continuous supply of wires from a reel by at least one pulley or channel, which guide the wire through the symmetry axes.

In addition, the present invention is directed to an apparatus for depositing at least one material on an inner wall of a pipe or rod, or on a wire. Such an apparatus comprises a laser capable of producing a pulsed laser beam, a target material a optionally positioned at an angle inclined to the symmetry axis of the pipe, rod or wire to be coated, and at least one lens which concentrates the beam onto the surface of the target material. The apparatus further comprises a chamber having at least one feed-through port and at least one window, wherein the chamber is capable of holding a vacuum, and optionally contains a heater assembly.

When deposition of a material in a symmetric configuration is desired, the lens assembly can be modified to include at least one negative conical lens and at least one spherical converging lens wherein said lenses shape the resulting beam into a cone or a truncated cone shape.

When flexible wires are to be coated, the above apparatus can be modified with a system that continuously guides the wires. For example, the continuous supply of wires from a reel can be accomplished by at least one pulley or channel, which guide the wire through the symmetry axes.

DETAILED DESCRIPTION OF THE INVENTION

For each of the embodiments described below, a versatile process is employed to deposit stoichiometric films which range in thickness from a few angstroms to a few microns. Since both the laser system and the atmosphere in which the process is carried out are a function of the material to be deposited, these parameters are altered accordingly. For the laser system, the determinative factor in practicing the claimed invention is the use of a laser that produces enough energy to evaporate a target material within the duration of a single pulse, regardless of the source of the laser energy. A selected target material may require the use of, for example, an Excimer laser, lasing in the ultra-violet range, or a YAG-type laser, lasing in the infrared region, to produce enough energy to evaporate the material. Therefore, a high power pulsed laser encompasses any pulsed laser system that can supply enough energy, typically 1–2 $J/cm^2$, to the surface of the target, to evaporate the material. While the present invention can also be practiced with a laser that produces a continuous beam that is incident on the target, i.e., an Ar laser, practical considerations such as process efficiency have made pulsed laser systems preferred over an equilibrium-type process utilizing continuous energy.

In addition to the laser employed, the atmosphere in which the deposition process occurs can be easily altered depending on the material to be deposited. For example, once the vacuum chamber is evacuated to a desired pressure, i.e., $10^{-6}$–$10^{-7}$ Torr, it can be backfilled to the milli-Torr range with an appropriate atmosphere. The atmosphere can vary from an oxygen atmosphere that aids in the deposition of a ceramic superconductor to a reducing atmosphere that aids in the deposition of a nitride material.

Figure 1:
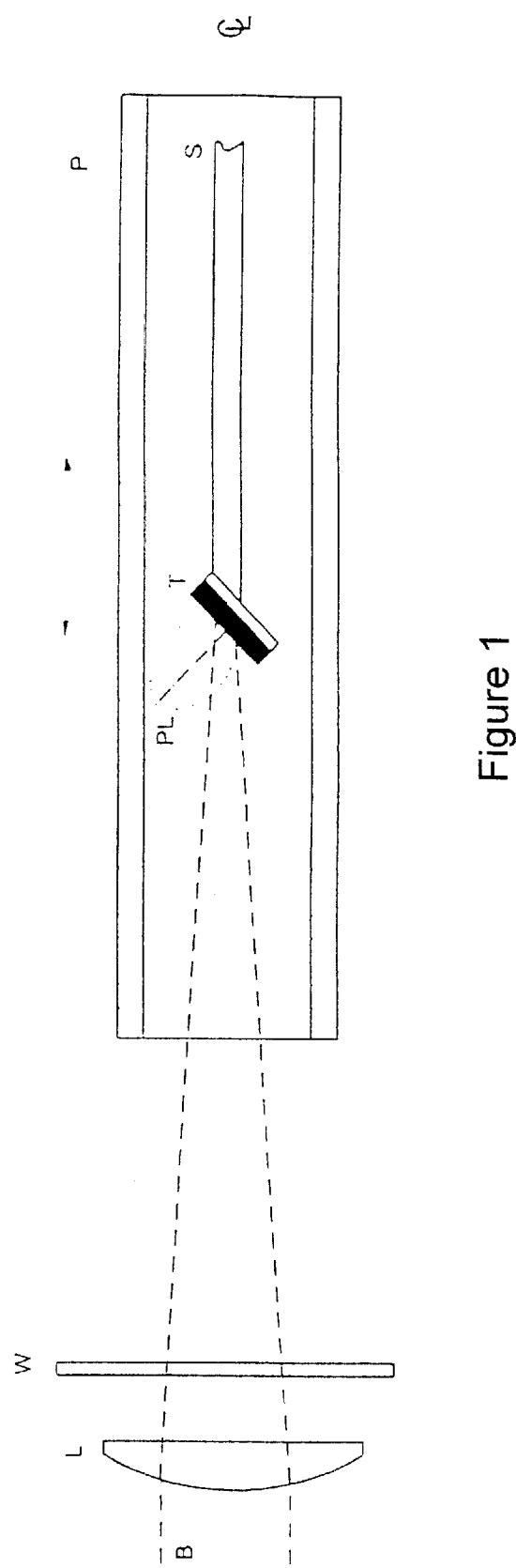
FIG. 1 illustrates a high power pulsed laser beam apparatus wherein the beam passes through a positive lens and the target is placed at an angle to the beam.

An object of this invention thus relates to a method for depositing materials on the inner walls of a pipe or rigid rod. In this embodiment, a high power pulsed laser beam (B, FIG. 1) passes through a positive lens (L), which concentrates the light onto the surface of the target material (T) to be ablated by the laser. As most depositions must take place either in vacuum or in a low-pressure atmosphere other than air, the process will take place inside an appropriate chamber, and a window (VW) must be provided for passage of the light beam. The target is placed within the pipe (P) to be coated, as shown in FIG. 1, and slanted so that the beam will intercept it at some convenient angle (45°, for example). The target is located at a relatively short distance from the focal plane of lens (L), so that the light intensity at the target is sufficient to ablate and evaporate material, and is joined to a shaft whose axis coincides with the pipe axis of symmetry. The plume (PL) of evaporated material reaches the pipe inner wall at an angle, corresponding to the target inclination, as shown in FIG. 1. For small-diameter pipes it may be more convenient in some cases to keep the target perpendicular or near-perpendicular to the beam.

Figure 2:
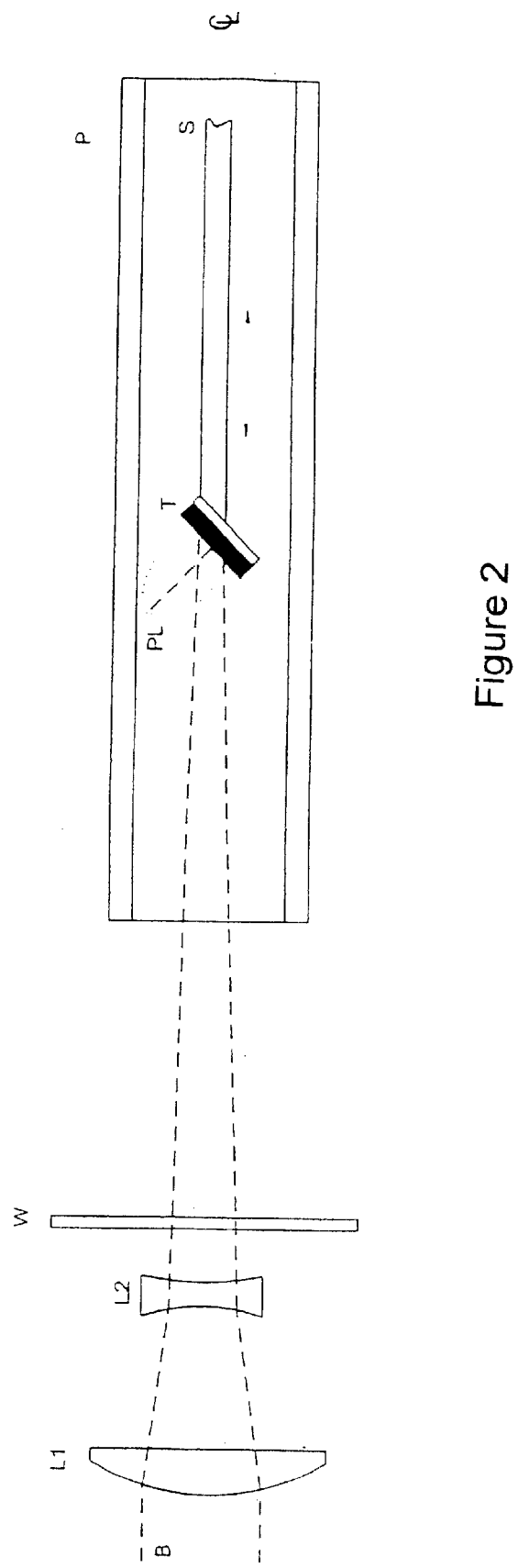
FIG. 2 illustrates a high power pulsed laser beam apparatus using a multiple-lens setup.

In order to coat the inner wall of the pipe uniformly, relative motions, both angular and longitudinal, are required between the pipe and the ablation spot. Angular motion may be provided by rotating either the pipe or the shaft (S), or both in opposite directions, around their common axis of symmetry. Linear motion may be provided by shifting either the pipe or the target-shaft arrangement along the axis of symmetry. Again, a combination of both of these motions in opposite directions may be employed. If target motion along the axis is used, it will be required to maintain the laser spot geometry at target (T) constant, in order to avoid changes in deposition yield. This can be easily achieved in two ways: (1) by shifting lens (L) along the axis simultaneously with, and by the same distance as, the target-shaft assembly; or (2) by employing a multiple-lens setup, such as the one indicated in FIG. 2, so that the size of the laser spot at target (T) can be adjusted for a large range of motion of target (T) by a small motion of one of the lenses in the setup, for example, L2 in FIG. 2. The first way is more direct, but limited in applicability because the fixed focal length of the single lens will confine the length of pipe which can be coated to a value substantially smaller than this focal length. The largest separation allowable between lens (L) and window (W) (FIG. 1) is limited by the damage threshold intensity for the window.

Figure 3:
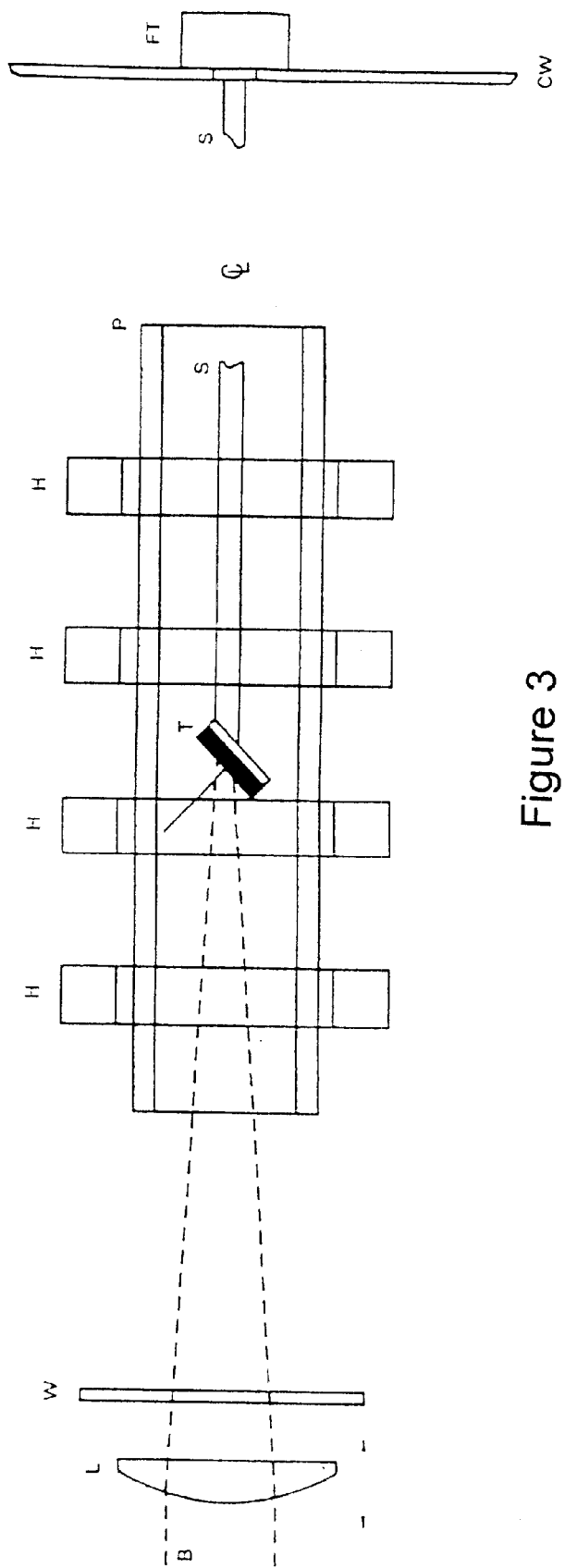
FIG. 3 illustrates a high power pulsed laser beam apparatus that allows motion of the target assembly by a linear vacuum feedthrough and further employs a coaxial heater assembly.

Motion of the target-shaft assembly is effected by means of a rotary/linear vacuum feedthrough (FT in FIG. 3) connecting the shaft (S) to motion equipment external to the chamber, through the chamber wall (CW).

Figure 4:
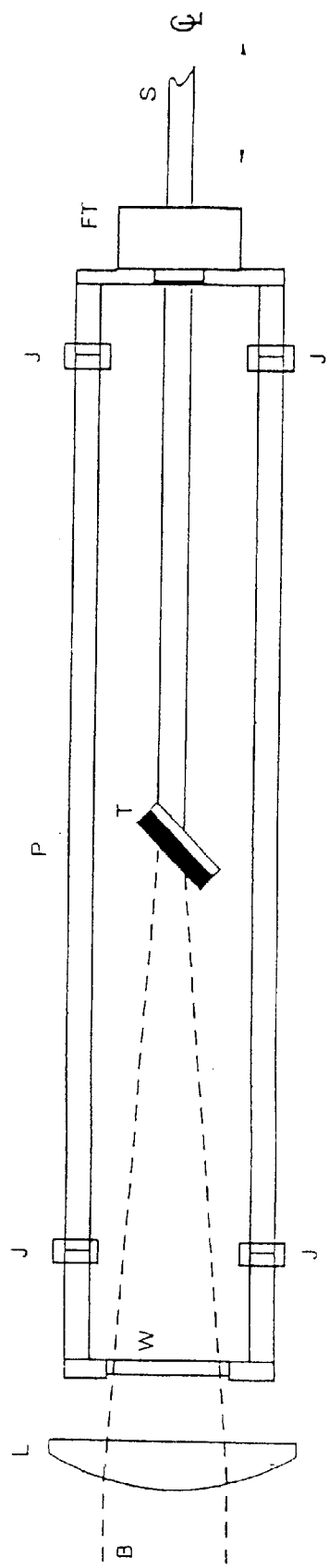
FIG. 4 illustrates a high power pulsed laser beam apparatus wherein the cylindrical chamber wall is constituted by the pipe to be coated itself.

Either of the systems described above can be readily placed in a vacuum chamber with a cylindrical configuration. Some of the materials to be deposited on the pipe inner walls require specific substrate temperatures, often much higher than room temperature, in order for desired phases to form. This can be conveniently provided, without necessarily contacting the pipe, by a coaxial heater assembly (H in FIG. 3) which can heat the pipe (P), for example, by radiation from toroidal lamps, or by inductively coupling RF energy to the pipe. Another possible configuration (FIG. 4) is one in which the cylindrical chamber wall is constituted by the pipe to be coated itself. In this case, the lids of the chamber will be the window and target-shaft-feedthrough assemblies. These are attached to the pipe by suitable vacuum seals (J in FIG. 4). All required service ports, such as for pumping, gas flow, pressure gauges, etc., can be located in these two attachments. The arrangement just described is convenient if the operation of coating pipes of the same diameter must be performed repeatedly, as this is the most compact apparatus possible. Also, heating of the pipe and monitoring of its temperature can be accomplished very easily in the latter case, as the outer pipe wall is available externally.

Figure 5:
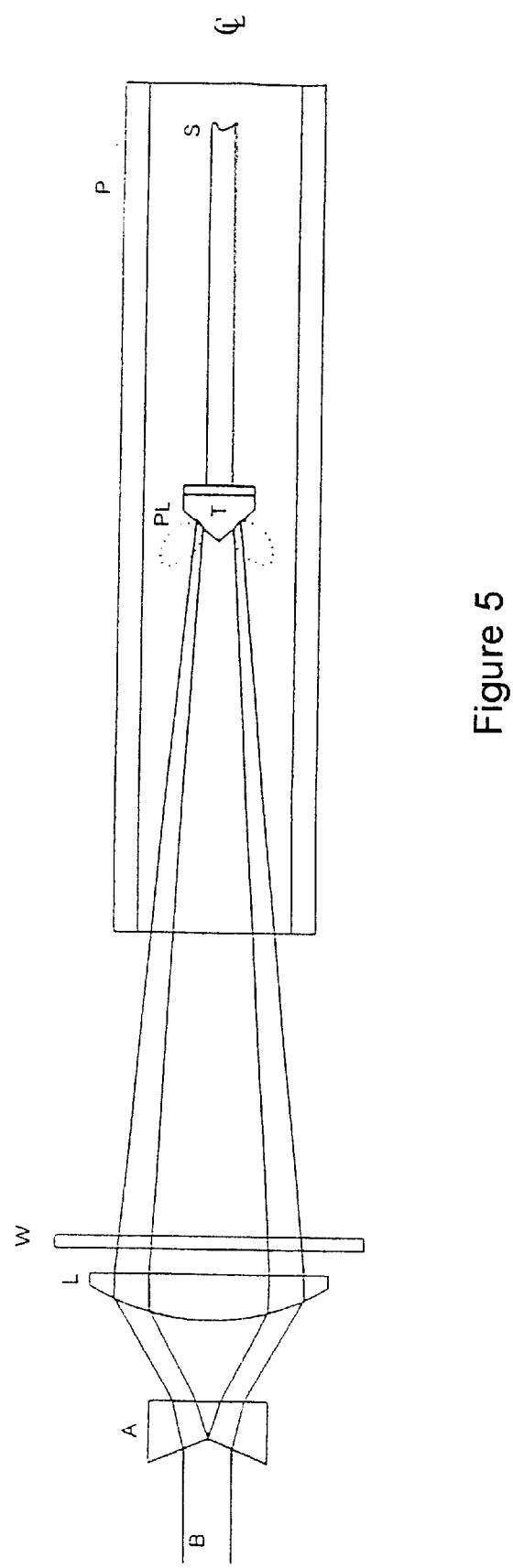
FIG. 5 illustrates an axially symmetric, high power pulsed laser beam apparatus wherein the beam passes through a negative conical lens.

A second object of this invention relates to a method for depositing materials on the inner walls of a pipe in a symmetric configuration. In this embodiment, the laser beam is shaped by suitable optics into a conic beam incident onto a conic target. surface which is subsequently ablated by the laser. More specifically, an axially symmetric laser beam (B, FIG. 5) passes through a negative conical lens (A), also known as an axicon, along its axis. As shown in FIG. 5, this lens shapes the beam into a diverging conical fan which is then intercepted by a spherical converging lens (L). This second lens changes the fan direction and concentrates the light into a circle which would coincide with the focal plane of lens (L). The surface of the target material (T) to be ablated by the laser is shaped as a cone or truncated cone, as shown, so that the beam will intercept it at some convenient angle (45°, for example). The target is held by a shaft (S) and located at a distance from the focal plane of lens (L), so that the laser beam "footprint" at the target surface is actually an annular ring. The high intensity pulsed light at target (T) produces a plume (PL) of evaporate material. As the PLD process is normally conducted in a vacuum chamber, and the optics are usually placed outside the chamber in order to avoid coating them, an optical window (W) allowing the passage of laser light into the chamber ambient will be required.

The distance between the target (T) and the focusing lens (L) is adjusted so that the desired light intensity at the target surface is obtained. The symmetry axes of the target and both lenses are collinear. With this geometry, the laser-generated plume will have a conical shape, and will be directed away from the common symmetry axis of the setup. The pipe or tube to be coated (P) should be located with its longitudinal axis coincident with this symmetry axis (FIG. 5). Clearly, from the symmetry, the rate of evaporate incidence on the pipe wall is the same for every direction in the cone generated by the plume. This will ensure angular uniformity of coverage for the pipe being coated.

In order to coat a length of the pipe (P) it is sufficient to cause relative motion between the pipe and the shaft (S) along their common axis. The speed of this motion will determine, for fixed target ablation conditions at a given geometry, the thickness of the resulting film. Linear motion may be provided by shifting either the pipe or the target shaft arrangement along the axis of symmetry. A combination of both of these motions in opposite directions may also be employed. If target motion along the axis is used, it will be required to maintain the laser "footprint" geometry at (T) constant, in order to avoid changes in deposition yield. This can be achieved by coordinated motion of the A-L lens combination. The length of rigid rod or pipe which can be coated in this setup is limited by the distance between the window (W) and the target (T). This distance depends in turn on the detail of the focal length of lens (L) and the apex angle of the conical lens (A). It is possible to select these parameters to accommodate a pipe length of tens of centimeters by using a long focal length for lens (L). It can be more convenient, however, to modify the setup to include a second axicon (A2 in FIG. 6). This second conic lens has the same (or nearly the same) apex angle as A, but is positive instead of negative. Its diameter also needs to be larger in order to intercept the complete light fan generated by lens (A). With the configuration shown in FIG. 6, the focal length of lens (L) can be chosen to be longer, as its function is then just to focus the light beam. The distance between the two axicons A and A2 in the setup of FIG. 6 will determine the radius of the ray fan intercepted by lens (L).

Figure 6:
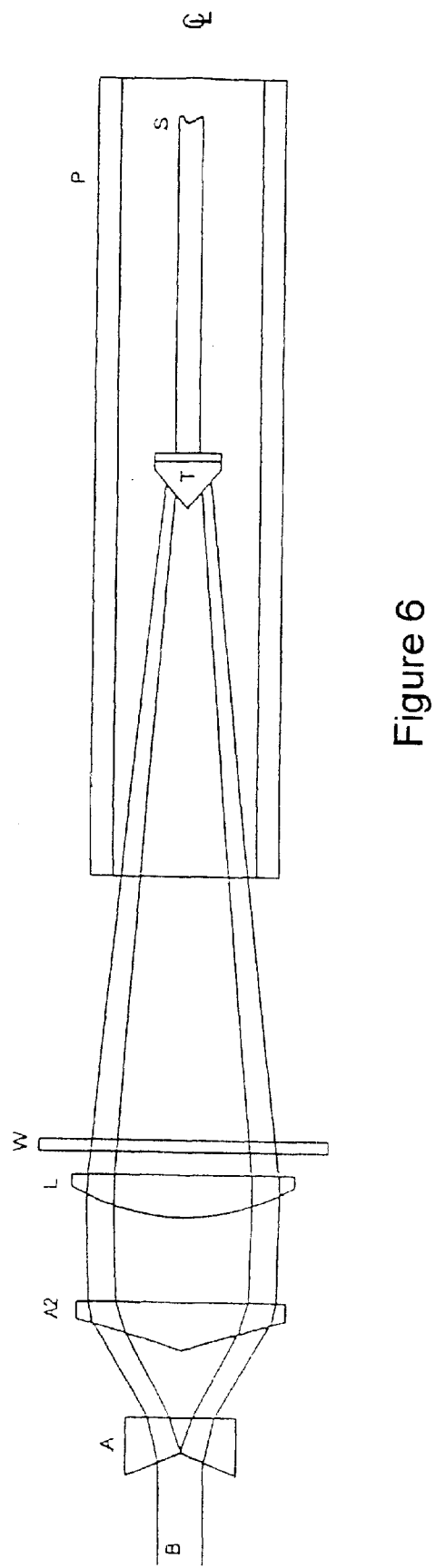
FIG. 6 illustrates an axially symmetric, high power pulsed laser beam apparatus wherein the beam passes through both a negative and positive conical lens.

If the lens (L) in FIG. 6 is replaced by a combination of spherical lenses so that the focal length of the combination is variable, an additional flexibility is introduced, with the advantage of allowing a relatively short motion of one lens to compensate for much longer displacements of the target-shaft assembly.

The second setup (FIG. 6) makes it easier to modify the exact radius of the laser beam footprint on the target. Slight modification of this radius is convenient in order to use more effectively the target area as the coating process proceeds and avoid undesirable plume changes due to crater formation. Simultaneous adjustment of the position of lens (L) (or its focal length, if it is a multiple-element lens) will be required in this case in order to maintain a constant deposition rate at the surface being coated. The setup of FIG. 6 also provides the possibility of using a smaller cone angle for the conical beam issuing after lens (L). This is advantageous in that it allows pipes with larger aspect ratios (length to diameter) to be coated.

Figure 7:
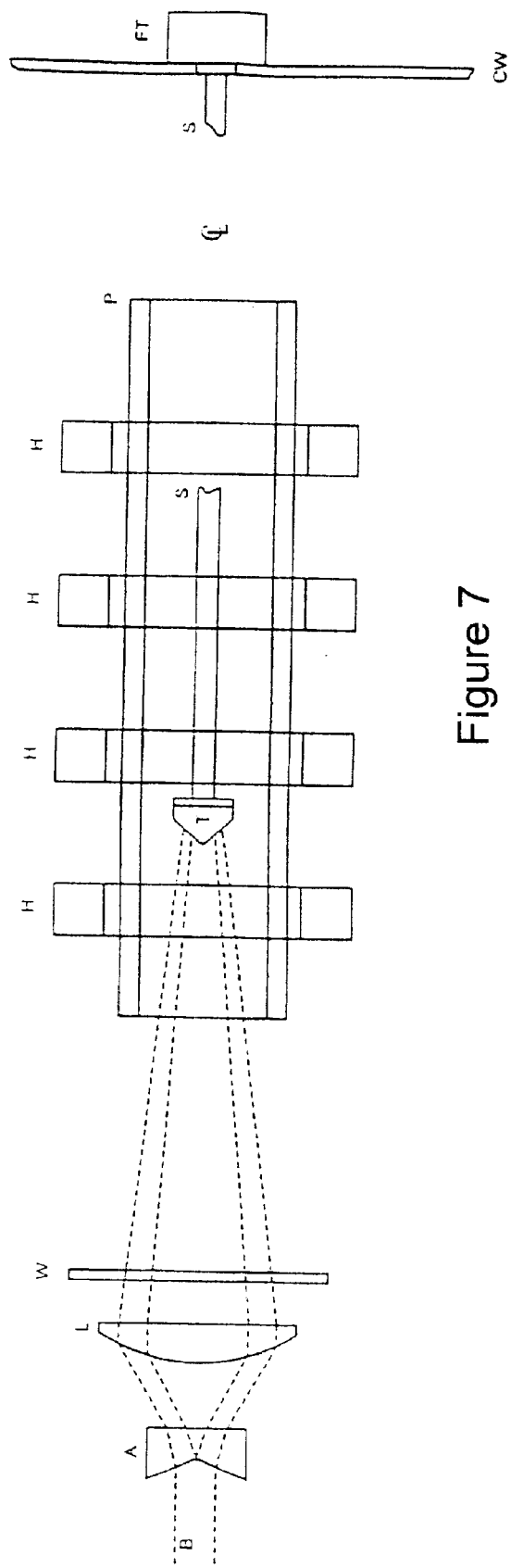
FIG. 7 illustrates an axially symmetric, high power pulsed laser beam apparatus that allows motion of the target assembly by a linear vacuum feedthrough and further employs a coaxial heater assembly.

Motion of the target-shaft assembly, if required, can be effected by means of a linear vacuum feedthrough (FT in FIG. 7) connecting the shaft (S) to motion equipment external to the chamber through the chamber wall (CW). Rotary motion of the target is not necessary, but can be provided if a linear/rotary feedthrough is used instead of a linear one.

Either of the systems described above can be readily placed in a vacuum chamber with a cylindrical configuration. Some of the materials to be deposited on the pipe inner walls require specific substrate temperatures, often much higher than room temperature, in order for desired phased to form. This can be conveniently provided, without necessarily contacting the pipe, by a coaxial heater assembly (H in FIG. 7) which can heat the pipe (P), for example, by radiation from toroidal lamps, or by inductively coupling RF energy to the pipe. The pipe can be inserted and extracted from the vacuum chamber by means of a differentially pumped secondary chamber, in order to accelerate processing times.

Figure 8:
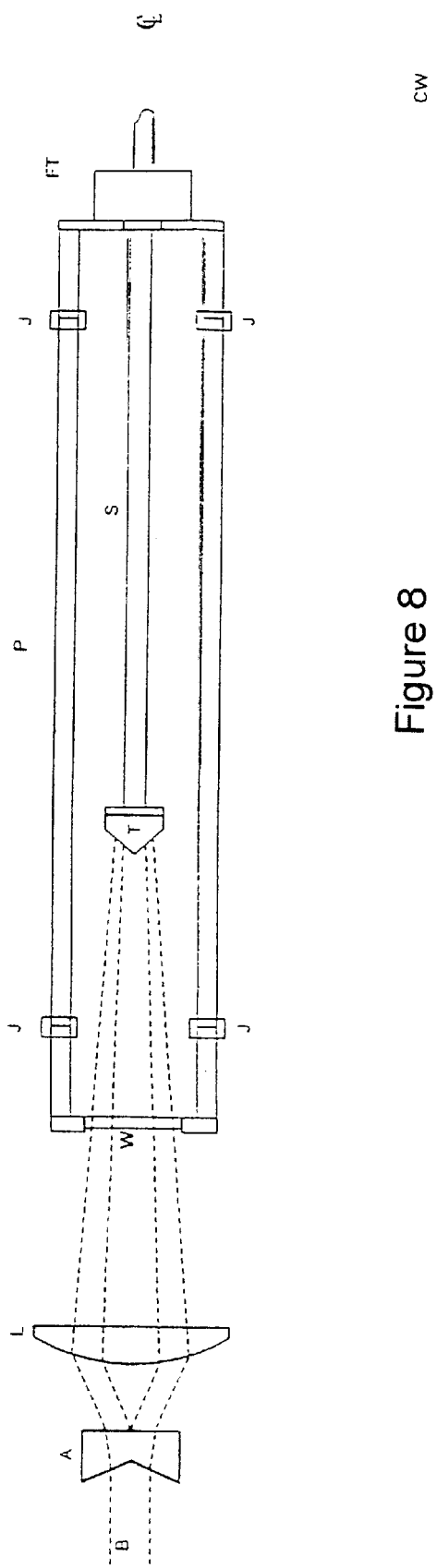
FIG. 8 illustrates an axially symmetric, high power pulsed laser beam apparatus wherein the cylindrical chamber wall is constituted by the pipe to be coated itself.

Another possible configuration (FIG. 8) is one in which the cylindrical chamber wall is constituted by the pipe to be coated itself. In this case, the lids of the chamber will be the window and target-shaft-feed through assemblies. These are attached to the pipe by suitable vacuum seals (J in FIG. 8). All required service ports, such as for pumping, gas flow, pressure gauges, etc., can be located in these two attachments. This arrangement is convenient if the operation of coating pipes of the same diameter must be performed repeatedly, as this is the most compact apparatus possible. Also, heating of the pipe and monitoring of its temperature can be accomplished very easily in the latter case, as the outer pipe wall is available externally.

Figure 9:
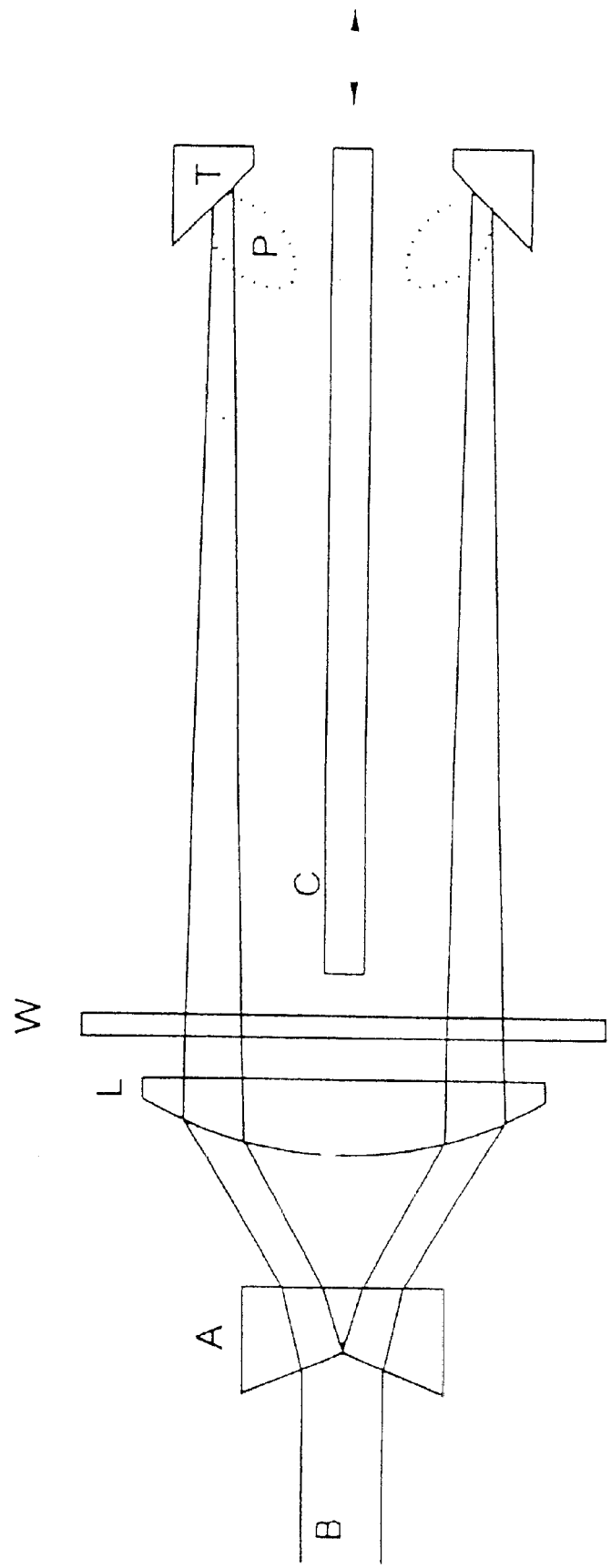
FIG. 9 illustrates an axially symmetric, high power pulsed laser beam apparatus wherein the beam passes through a negative conical lens.

Another object of this invention relates to a method for depositing materials on the outer walls of a wire or pipe. In this embodiment, an axially symmetric laser beam (B) passes through a negative conical lens (A), also known as an axicon, along its axis. As shown in FIG. 9, this lens shapes the beam into a diverging conical fan which is then intercepted by a spherical converging lens (L). This second lens changes the fan direction and concentrates the light into a circle which would coincide with the focal plane of lens (L).

The surface of the target material (T) to be ablated by the laser is shaped into a conic section, as shown, so that the beam will intercept it at some convenient angle (45°, for example). The target is located at a distance from the focal plane of lens (L), so that the laser beam "footprint" at the target surface is actually an annular ring. The high intensity pulsed light at T produces a plume (P) of evaporate material. As the PLD process is normally conducted in a vacuum chamber, and the focusing optics are usually placed outside the chamber in order to avoid coating them, an optical window (W) allowing the passing of the laser light into the chamber ambient will be required.

The distance between the target (T) and the focusing lens (L) is adjusted so that the desired light intensity at the target surface is obtained. The symmetry axes of the target and both lenses are collinear. With this geometry, the laser-generated plume will have a conical shape, pointed towards the common symmetry axis of the setup. The wire, rod, or pipe to be coated (work piece C) should be located with its longitudinal axis coincident with this symmetry axis. Clearly, from the symmetry, the rate of evaporate incidence from the target towards the symmetry axis is substantially the same for every direction. This will ensure angular uniformity of coverage for the cylindrical object being coated.

In order to coat a length of the object (C) it is sufficient to move it longitudinally along the symmetry axis at a constant rate. The speed of this motion will determine, for fixed target ablation conditions at a given geometry, the thickness of the resulting film.

Figure 10:
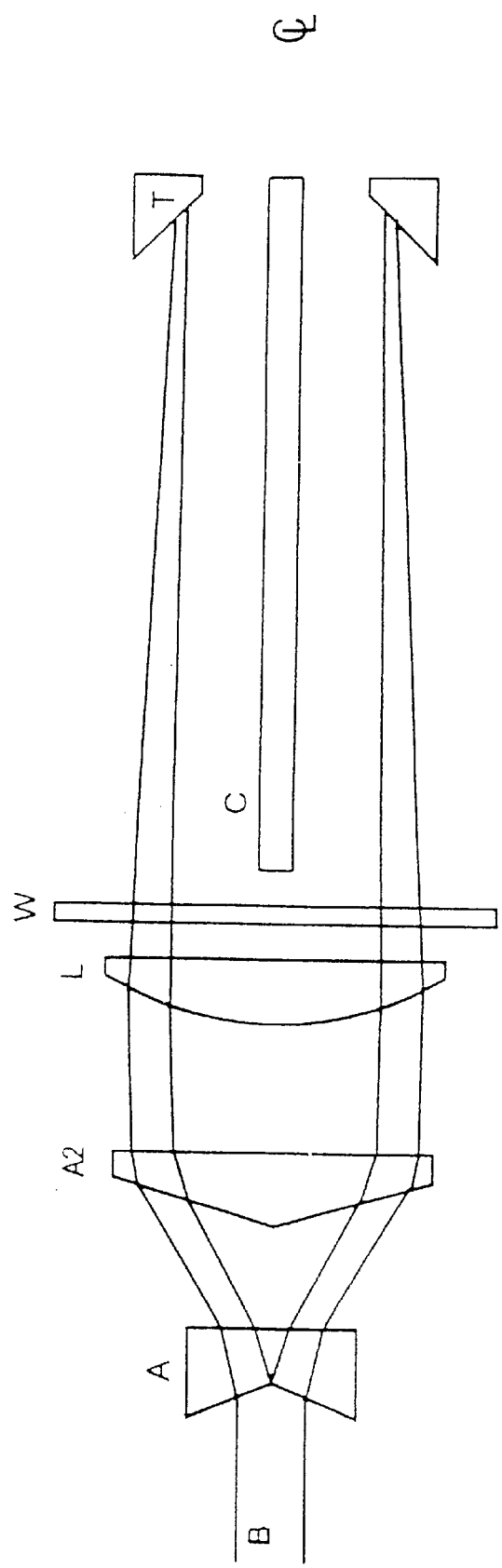
FIG. 10 illustrates an axially symmetric, high power pulsed laser beam apparatus wherein the beam passes through both a negative and positive conical lens.

The length of rigid rod or pipe which can be coated in this setup is limited by the distance between the window (W) and the target (T). This distance depends in turn on the detail of the focal length of lens (L) and the apex angle of the conical len(A). It is possible to select these parameters to accommodate a rod length of tens of centimeters by using a long focal length for lens (L). It can be more convenient, however, to modify the setup (FIG. 10) to include a second axicon (A2). This second conic lens has the same (or nearly the same) apex angle as A, but is positive instead of negative. Its diameter also needs to be larger in order to intercept the complete light fan generated by lens (A). With the configuration shown in FIG. 10 the focal length of lens (L) can be chosen to be longer, as its function is then just to focus the light beam. The distance (D) between the two axicons A and A2 in the setup of FIG. 10 will determine the radius of the ray fan intercepted by lens (L). This second setup makes it easier to modify the exact radius of the laser beam footprint on the target. Slight modification of this radius is convenient in order to use more effectively the target area as the coating process proceeds and avoid undesirable plume changes due to crater formation. Simultaneous adjustment of the position of lens (L) will be required in this case in order to maintain a constant light intensity at the target surface. Changes in the laser beam footprint radius at the target will cause changes in the deposition rate at the surface being coated. If the deposition rates cannot be tolerated, they can be compensated in the process by changing the light intensity or the speed of motion of the work piece.

Figure 11:
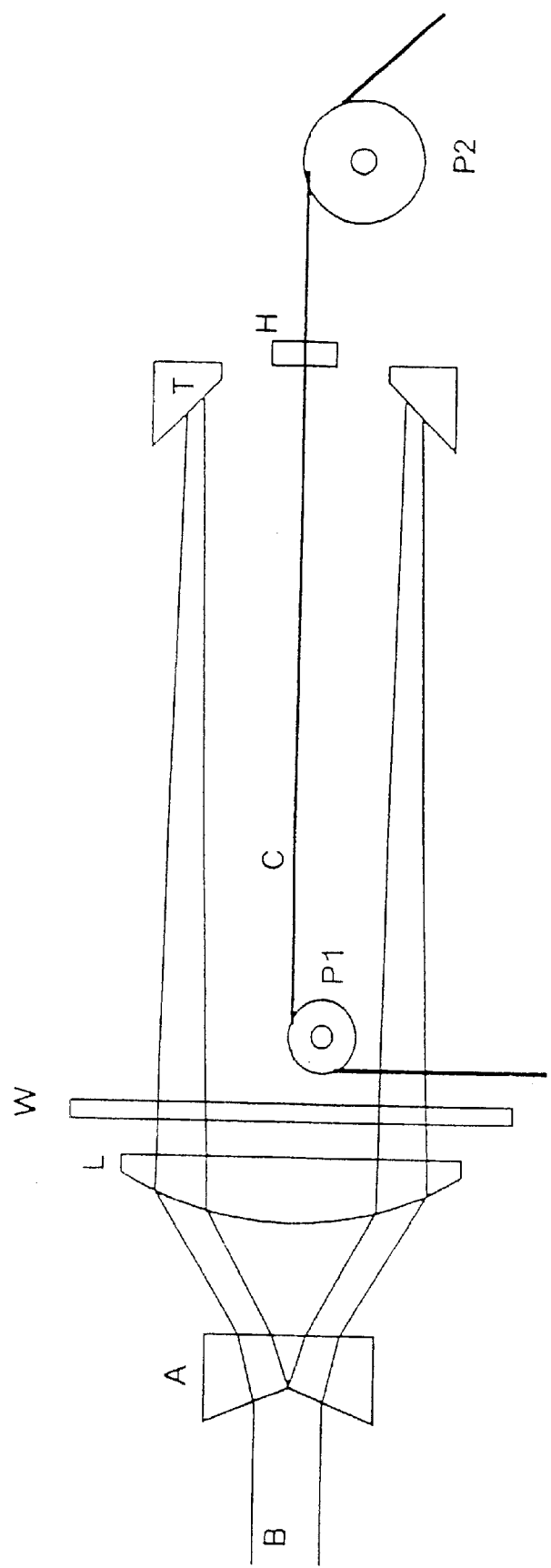
FIG. 11 illustrates how a set of pulleys or channels guide a wire under tension through the optical axis of the coating system, allowing the coating of a long length of wire that is continuously supplied from a reel.

If the work piece to be coated is a flexible wire, a convenient setup is shown in FIG. 11 that allows coating a long length of the wire by continuously supplying it laterally from a reel. A set of pulleys or channels guide the wire under tension through the optical axis of the coating system. The first pulley (P1) can be conveniently kept inside the "dark zone" between (L) and (T), so it does not intercept any light.

The wire itself being fed laterally, and the pulley axis do intercept the light beam, but this should have only a small effect on the uniformity of the resulting coating. If it is important to avoid excessive bending of the wire once the film has been deposited (in order to avoid delamination, for example) the take-up pulley or bobbin can be specified to have a sufficiently large diameter. Another possibility is to pass the wire straight out of the deposition chamber through a set of narrow openings with a differentially pumped intermediate volume. Once outside the chamber the wire can be further processed or cut to desired lengths while kept straight.

As some of the materials prepared by PLD require high substrate temperatures to achieve a high quality film, it will be necessary in some cases to heat the wire or rod being coated. This can be done in several convenient ways due to the cylindrical geometry of the setup; for example, by means of an annular heating filament or lamp (H) located near (or right behind) the target (T) (FIG. 11). If a wire to be coated is electrically conducting, a current may instead be passed trough it between the feed pulley (P1) and the take-up pulley (P2), thus causing the wire to be heated to a predetermined temperature at the deposition zone.

Figure 12:
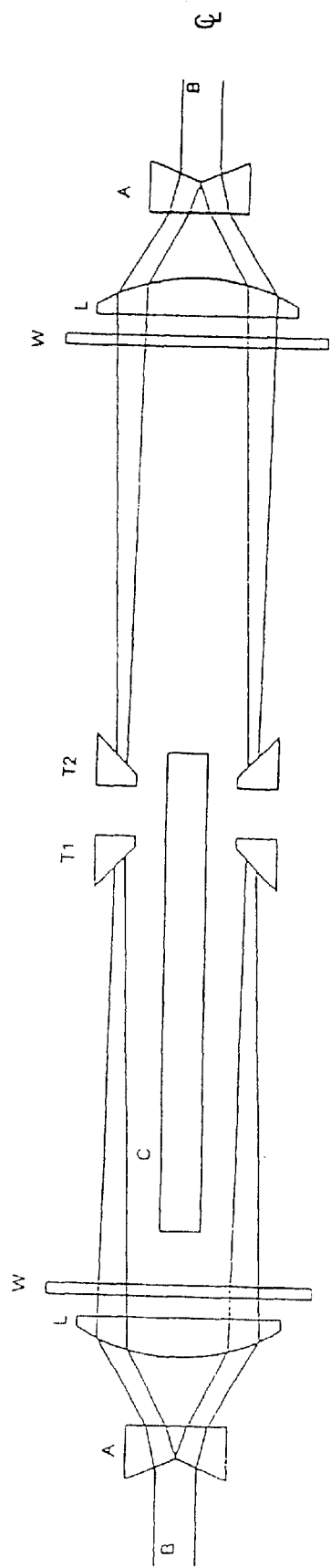
FIG. 12 illustrates how the cylindrical geometry of the inventive apparatus allows also for convenient processing after the film has been deposited. In this figure, the space between the two targets (T1, T2) may be used to provide a drive mechanism to move the work piece.

The cylindrical geometry allows also for convenient processing after the film has been deposited. For example, other coatings may be deposited by other methods or by PLD. An accessible manner of depositing a second coating by PLD is by using a similar arrangement from the other side, as shown in FIG. 12. In this case, the space between the two targets (T1, T2) may be used to provide a drive mechanism to move the wire, rod or pipe work piece.

It is understood that various other modifications will be apparent to and can be readily made by those skilled in the art without departing from the scope or spirit of the invention. Accordingly, it is not intended that the scope of the following claims be limited to the forgoing description. Rather, the claims should be construed as also encompassing features that would be treated as equivalents thereof by those skilled in the art to which this invention pertains.

What is claimed is:

1. A method for depositing at least one material from a target surface onto an inner wall of a pipe, said method comprising:

passing a pulsed laser beam through at least one lens whereby said laser beam is caused to form an annular ring cross-section on the target surface of said at least one material, ablating said target surface with said laser beam, wherein the target surface is located within a pipe to be internally coated and is at an inclination with respect to the symmetry axis of the pipe, moving the pipe, the target, or both to produce motion between the pipe and the target so that said inner wall is coated with said material along a length of said pipe, and said method occurring in a vacuum or in a reduced-pressure atmosphere, optionally other than air.

2. The method according to claim 1, wherein said at least one material is a multicomponent material.

3. The method according to claim 2, wherein said multicomponent material is a ceramic oxide.

4. The method according to claim 1, wherein said at least one material is a carbide, nitride or diamond-like carbon.

5. A method for uniformly depositing at least one material from a target surface onto an inner wall of a pipe or rod that is in a symmetric configuration with the axes of a laser beam and said target surface, said method comprising:

passing an axially symmetric, pulsed laser beam through optics that shape the beam into a cone or a truncated cone, said optics comprising at least one negative conical lens and at least one spherical converging lens, wherein the symmetry axes of said target surface and said lenses are collinear, converging said laser beam towards the target surface, such that the beam has a substantially annular cross-section on the target surface.

ablating the target surface with the laser beam, whereby the beam produces a plume of evaporate material having a conical shape, placing said rod or pipe to be coated in a position whereby a longitudinal axis of said rod or pipe is coincident with said symmetry axes such that the rate of evaporate material incident on said inner wall is substantially the same for every direction in said plume, and moving said rod or pipe, said target surface, or both, to produce motion between the pipe and the target surface so that said inner wall is coated with said material along a length of said rod or pipe, wherein said inner wall is optionally heated above room temperature.

6. The method of claim 5, wherein the step of converging said laser beam towards the target surface further comprises converging said laser beam so that an annular ring forms on the target surface.

7. The method of claim 6, wherein the step of ablating the target surface further comprises ablating the target surface having a conic shape including a tip, wherein said tip is positioned with said annular ring so that the laser beam does not impinge upon said tip.

* * * * *